(12) United States Patent
Min et al.

(10) Patent No.: US 7,525,140 B2
(45) Date of Patent: Apr. 28, 2009

(54) INTEGRATED THIN FILM CAPACITORS WITH ADHESION HOLES FOR THE IMPROVEMENT OF ADHESION STRENGTH

(75) Inventors: Yongki Min, Phoenix, AZ (US); John Guzek, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 97 days.

(21) Appl. No.: 11/304,649

(22) Filed: Dec. 14, 2005

(65) Prior Publication Data

US 2007/0132063 A1 Jun. 14, 2007

(51) Int. Cl.
H01L 27/108 (2006.01)
H01L 29/76 (2006.01)
H01L 29/94 (2006.01)
H01L 31/119 (2006.01)

(52) U.S. Cl. .................. 257/296; 257/300; 257/303; 257/306; 257/307; 257/E27.114

(58) Field of Classification Search .......... 257/532, 257/E27.114, E25.01, E25.011, E25.015, 257/300, 303, 306, 307, 700, 723, 724, 499, 257/535, 777, 296

See application file for complete search history.

(56) References Cited

U.S. PATENT DOCUMENTS

| 5,583,739 | A  | * | 12/1996 | Vu et al. ................ 361/313 |
| 6,104,053 | A  | * | 8/2000  | Nagai ................... 257/303 |
| 6,239,459 | B1 | * | 5/2001  | Al-Shareef et al. ...... 257/296 |
| 6,400,576 | B1 | * | 6/2002  | Davidson .............. 361/763 |
| 6,407,929 | B1 | * | 6/2002  | Hale et al. ............ 361/763 |
| 6,477,034 | B1 | * | 11/2002 | Chakravorty et al. .... 361/306.3 |
| 6,485,988 | B2 | * | 11/2002 | Ma et al. ............... 438/3 |
| 6,724,611 | B1 | * | 4/2004  | Mosley ................ 361/306.3 |
| 6,774,477 | B2 | * | 8/2004  | Han .................... 257/686 |
| 6,803,641 | B2 | * | 10/2004 | Papa Rao et al. ........ 257/532 |
| 2001/0019144 | A1 | * | 9/2001 | Roy .................... 257/296 |
| 2004/0084761 | A1 | * | 5/2004 | Karthikeyan et al. ..... 257/700 |

\* cited by examiner

*Primary Examiner*—Theresa T Doan
*Assistant Examiner*—Sarah K Salerno
(74) *Attorney, Agent, or Firm*—Kenneth A. Nelson; Intel Corporation (57) ABSTRACT

In an embodiment, a substrate includes a thin film capacitor embedded within. In an embodiment, a plurality of adhesion holes extend through the thin film capacitor. These adhesion holes may improve the adhesion of the capacitor to other portions of the substrate.

13 Claims, 10 Drawing Sheets

INTEGRATED THIN FILM CAPACITORS WITH ADHESION HOLES FOR THE IMPROVEMENT OF ADHESION STRENGTH

FIELD OF THE INVENTION

The disclosed embodiments of the invention relate generally to integrated thin film capacitors, and relate more particularly to such capacitors having adhesion enhancing features.

BACKGROUND

Description of Related Art

There have been many efforts to integrate thin film capacitors into package substrates to improve electrical performance. Among various dielectric materials, hi-k ceramic materials show the highest dielectric constant (600-4000). However, hi-k ceramic thin film requires high temperature processing (e.g. furnace annealing at 600-800 C) to have high dielectric constant. If such a capacitor is formed in place on a package substrate, the high temperature processing may destroy the package substrate, which may have components with low melting temperatures.

BRIEF SUMMARY OF THE INVENTION

In an embodiment, the present invention includes a device having a substrate with an integrated capacitor featuring adhesion holes and a method of fabricating the same. In an embodiment, the adhesion holes enable better adhesion which may prevent de-lamination. In an embodiment, the present invention may be used to prevent de-lamination between the body of the embedded thin film capacitor. In yet another embodiment, the present invention may be used to prevent de-lamination between the embedded capacitor and a mounting substrate. In an embodiment, the integrated capacitor featuring adhesion holes may be used within an electronic package.

DETAILED DESCRIPTION OF THE PRESENT INVENTION

Figure 1A:
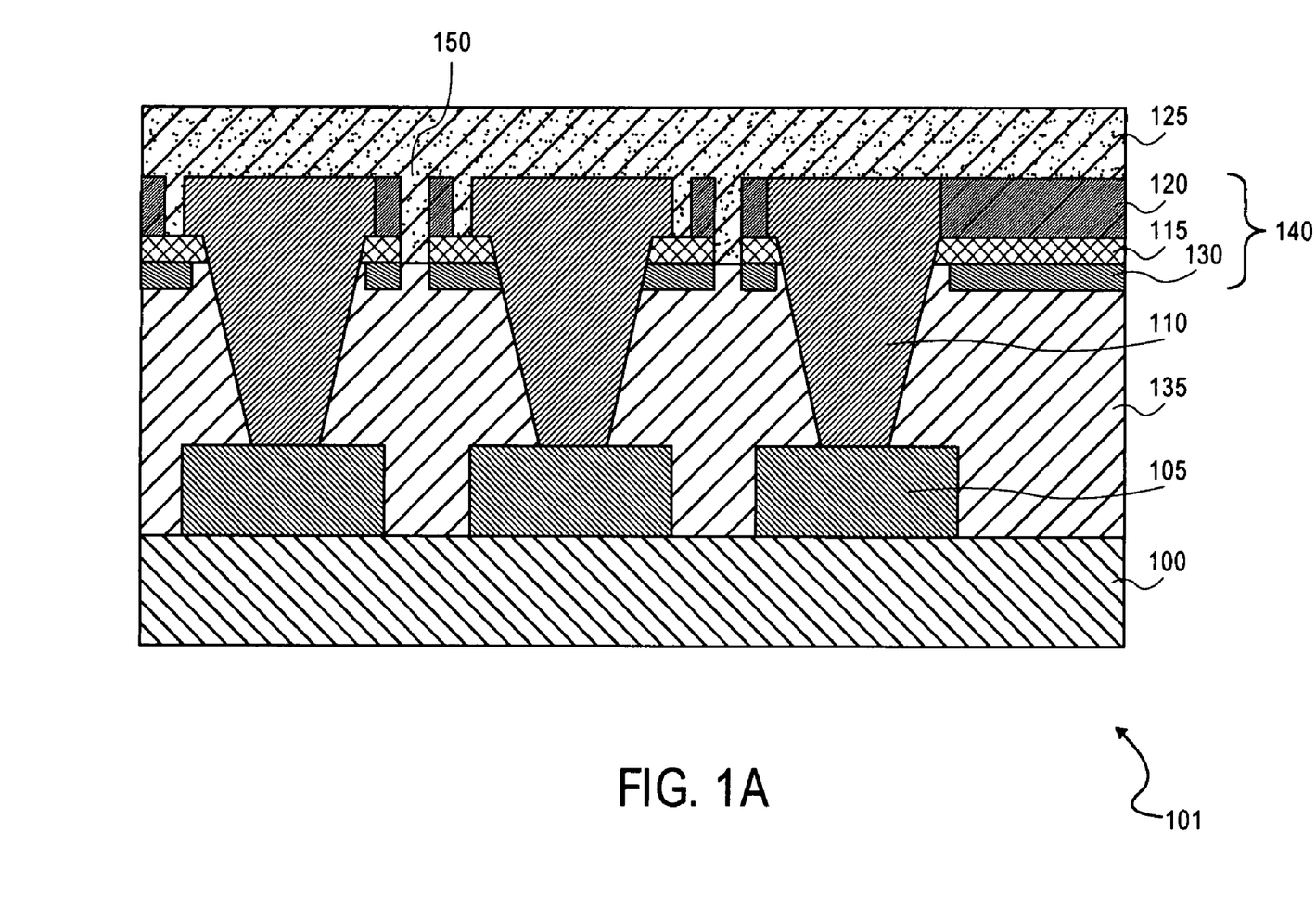
FIG. 1A is a cross-sectional illustration of a capacitor embedded in a substrate featuring an adhesion hole set according to an embodiment of the present invention.

In an embodiment as illustrated in FIG. 1A, device 101 features a capacitor 140. In an embodiment, device 101 features a base 100. In an embodiment, device 101 may comprise a contact 105 adjacent to a top portion of base 100. In an embodiment, a first insulating layer 135 may cover a top portion of base 100 other than the area occupied by contact 105. In an embodiment, device 101 may further comprise a conductive via 110 which may extend through first insulating layer 135 to contact 105. In an embodiment, a first electrode 130 may cover a top portion of the first insulating layer 135. In an embodiment, a dielectric film 115 may be adjacent to a top portion of first electrode 130. In an embodiment, dielectric film 115 may be adjacent to the bottom side of a second electrode 120 as illustrated in FIG. 1A. In an embodiment, a second insulating layer 125 may be adjacent to the top side of conductive via 110 and second electrode 120. In an embodiment, second insulating layer 125 may be the top layer in device 101. In an embodiment, device 101 further comprises an adhesion hole 150. In an embodiment, a material on top of capacitor 140 may contact a material below capacitor 140 through the adhesion holes 150, which may help prevent delamination of thin film capacitor 140. In an embodiment, the material on top of the capacitor 140 may be the second insulating layer 125 and the material below the capacitor 140 may be the first insulating layer 135, so the second insulating layer 125 may contact first insulating layer 135 within adhesion hole 150. In other embodiments, the first and second insulating layer 125, 135 may contact each other through the adhesion hole 150.

In an embodiment, base 100, contact 105, and first insulating layer 135 may be components of a package substrate. In an embodiment, base 100 may function as a mounting core of a package substrate and first insulating layer 135 may function as a package substrate dielectric. In an embodiment, contact 105 may be landing pads and function as electrodes for conductive via 110.

In an embodiment, first electrode 130, dielectric film 115, and second electrode 120 may be components of a capacitor 140. In an embodiment, capacitor 140 may be a thin film capacitor. First electrode 130 may comprise a metal foil or a metal film. In an embodiment when first electrode comprises a metal foil, first electrode 130 comprises copper. First electrode 130 may comprise nickel or platinum. In an embodiment, first electrode 130 may have a thickness in the range of 10 to 100 microns. In an embodiment, first electrode 130 may have a thickness of approximately 15 microns.

In an embodiment, dielectric film 115 comprises a hi-k dielectric material. In an embodiment, dielectric film 115 may comprise barium strontium titanate, barium titanate, or strontium titanate. In an embodiment, dielectric film comprises barium strontium titanate. In an embodiment, dielectric film 115 may have a thickness in the range of 1 to 5 microns. In an embodiment, dielectric film 115 may have a thickness of approximately 1 microns.

Second electrode 120 may comprise copper, nickel, or platinum. In an embodiment, second electrode 120 comprises copper. In an embodiment, second electrode 120 may have a thickness in the range of 10 to 20 microns. In an embodiment, second electrode 120 may have a thickness of approximately 15 microns.

In an embodiment, second insulating layer 125 may comprise polymer dielectric or silica reinforced polymer dielectric. In an embodiment, second insulating layer 125 may comprise silica reinforced polymer dielectric. In an embodiment, first insulating layer 135 and second insulating layer 125 substantially comprises the same material. In an embodiment, second insulating layer 125 has a thickness in the range of approximately 15 to 40 microns. In an embodiment, second insulating layer 125 has a thickness of approximately 30 microns.

Figure 1B:
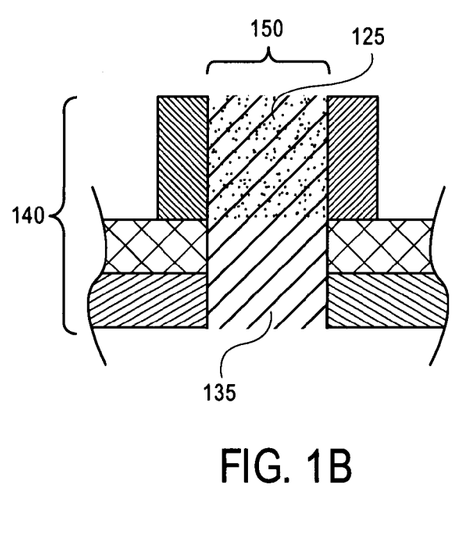
FIGS. 1B-1D are cross-sectional illustrations of varying proportions and volumes of first and second insulating layers within an adhesion hole according to an embodiment of the present invention.
Figure 1C:
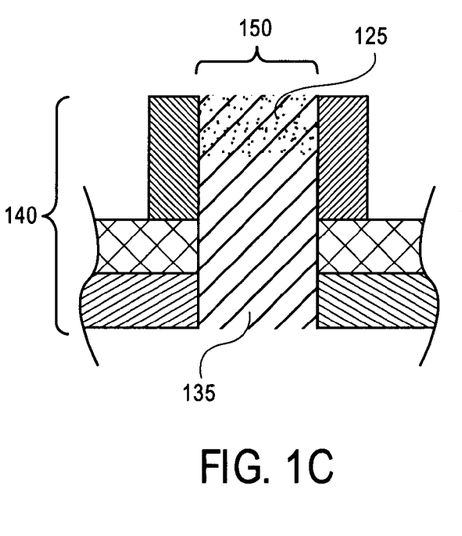
Figure 1D:
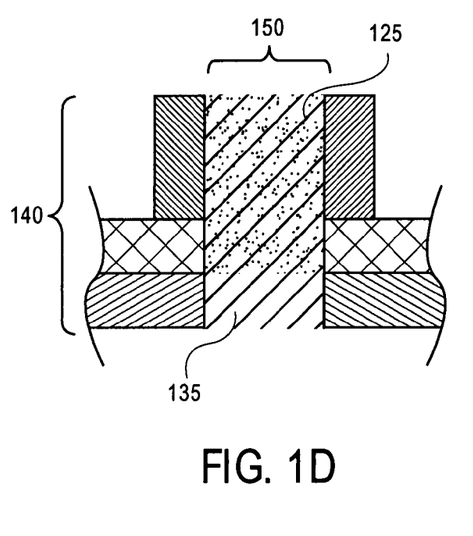

In an embodiment, second insulating layer 125 and first insulating layer 135 may make up varying volumes and proportions within adhesion hole 150. In an embodiment, second insulating layer 125 and first insulating layer 135 may make up approximately equal volumes within adhesion hole 150 as illustrated in FIG. 1B. In another embodiment, second insulating layer 125 may make up a lesser volume within adhesion hole 150 than first insulating layer 135 as illustrated in FIG. 1C. In yet another embodiment, second insulating layer 125 may make up a greater volume within adhesion hole 150 than first insulating layer 135 as illustrated in FIG. 1D.

Figure 2:
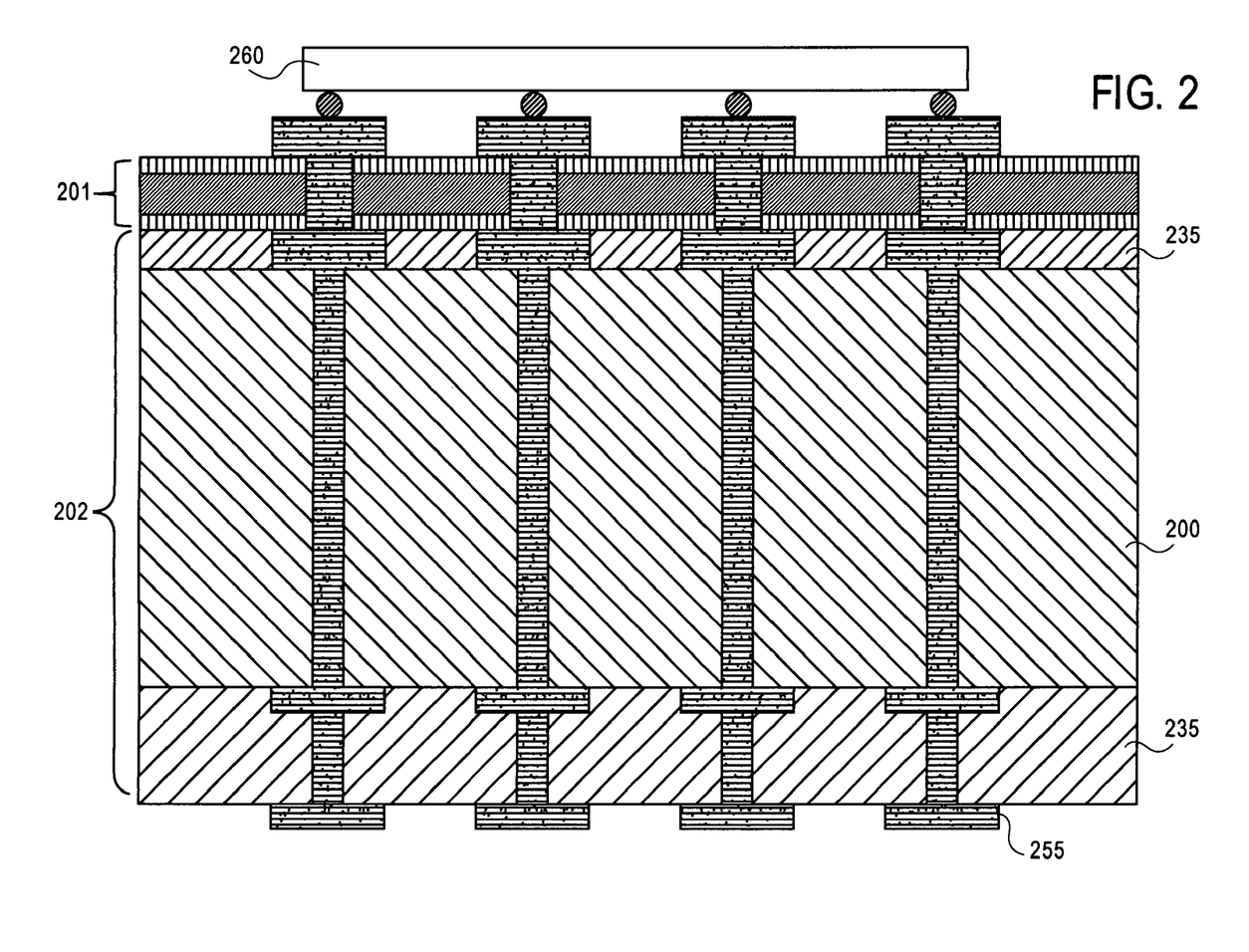
FIG. 2 is a cross-sectional illustration of a capacitor embedded in a substrate featuring an adhesion hole set and vias coupled to a semiconductor die according to an embodiment of the present invention.

In an embodiment, a via 255 extends through capacitor 201 and substrate 202 as illustrated in FIG. 2. In an embodiment, substrate 202 comprises build-up dielectric layer 235 and core 200. In an embodiment, via 255 may provide a conductive conduit through thin film capacitor 201 and substrate 202 to die 260.

Figure 3A:
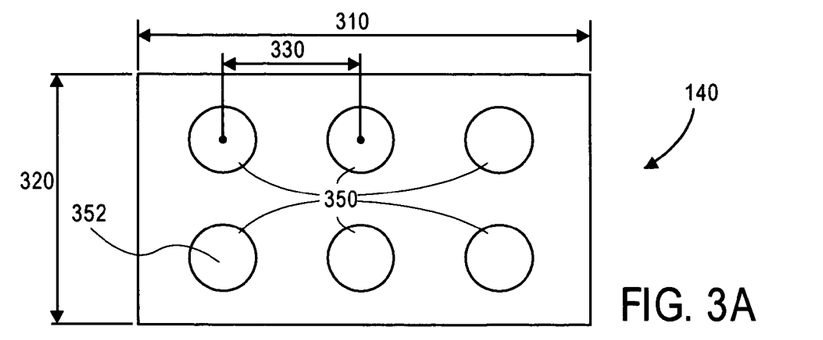
FIG. 3 is a top view of a capacitor embedded in a substrate featuring an adhesion hole set according to an embodiment of the present invention.
Figure 3B:
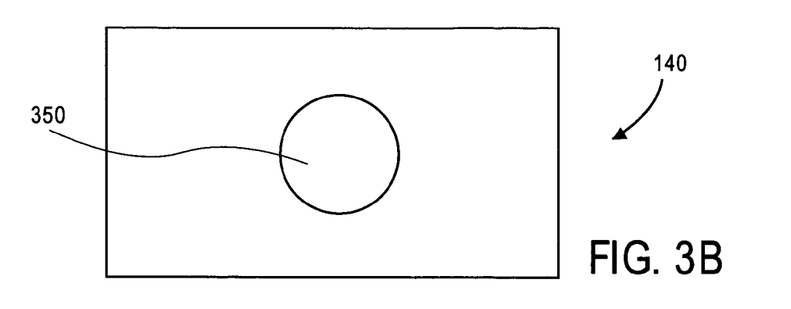

FIG. 3A is a top view that illustrates capacitor 140 and adhesion holes 350. In an embodiment as illustrated in FIG. 3A, one or more adhesion holes 350 may be part of an adhesion hole set through the capacitor 140. In an embodiment, adhesion hole set may comprise 1 to 20 adhesion holes 350. In an embodiment, adhesion hole set may comprise 16 adhesion holes 350. In an embodiment, adhesion hole set may comprise one adhesion hole 350 as illustrated in FIG. 3B.

In the illustrated embodiment, the capacitor 140 has a substantially rectangular shape, although the capacitor 140 may have other shapes in other embodiments. The capacitor 140 has a length 310 and a width 320, which may be used to calculate a surface area of the capacitor 140. In other embodiments where the capacitor 140 has a non-rectangular shape, the surface area of the capacitor 140 may be calculated differently.

Similarly, each adhesion hole 350 may have a size expressed in relation to the diameter of adhesion holes 350. In an embodiment, the diameter of adhesion hole 350 may range from 100 microns to 200 microns. In an embodiment, the diameter of an adhesion hole 350 may be approximately 100 microns. In an embodiment, small diameters are desirable to reduce the loss of capacitance from area consumed by adhesion holes 350.

Figure 3C:
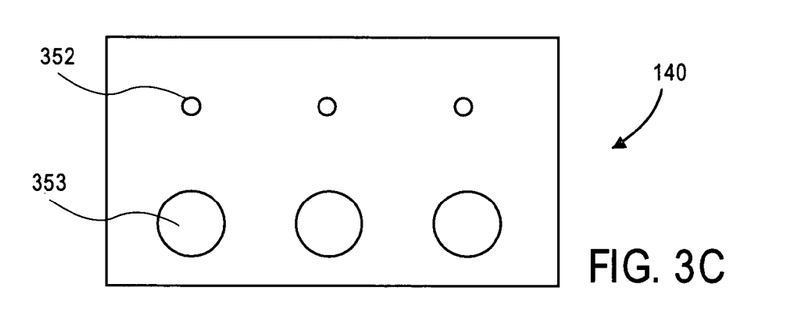

In an embodiment, adhesion hole set may comprise adhesion holes 350 with varying areas as illustrated in FIG. 3C. As further illustrated in FIG. 3C, adhesion holes set may comprise adhesion hole 353 and adhesion hole 352. As illustrated, the area of adhesion hole 353 may be greater than the area of adhesion hole 352.

Figure 3D:
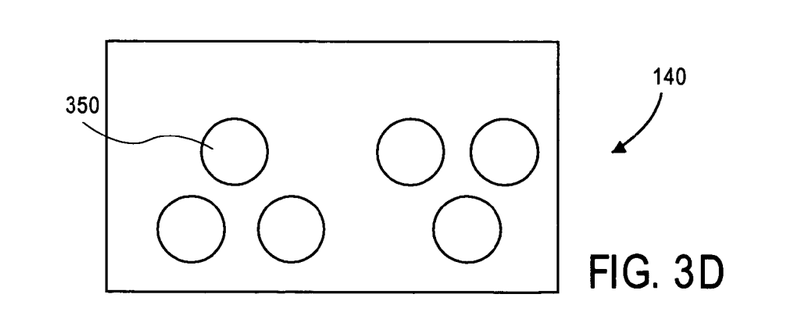

In an embodiment, adjacent adhesion holes 350 may be a distance 330 from each other, as shown in FIG. 3A. The distance 330 between adhesion holes 350 may be measured from center to center of adjacent adhesion holes 350. In an embodiment, adhesion hole set may comprise adhesion holes 350 spaced substantially equal apart as illustrated in FIGS. 3A and 3C. In an embodiment, the distance 330 between adhesion holes may be between about 500 microns to about 2000 microns. In other embodiments, adhesion hole set may comprise adhesion holes 350 that are not spaced substantially equally apart. In FIG. 3D, adhesion hole 350 is not spaced substantially equal from other proximate adhesion holes 350 within the same row or column.

Figure 3E:
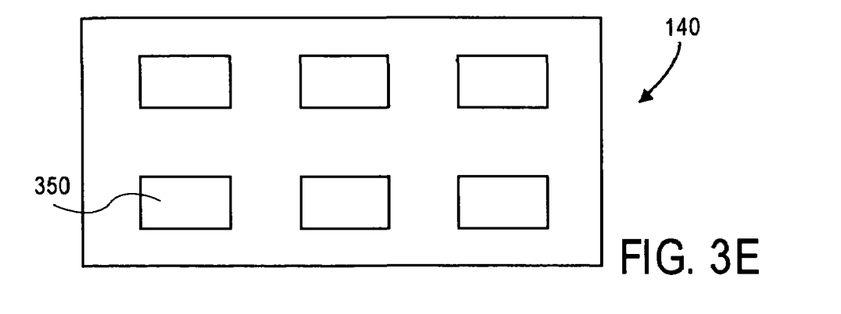
Figure 3F:
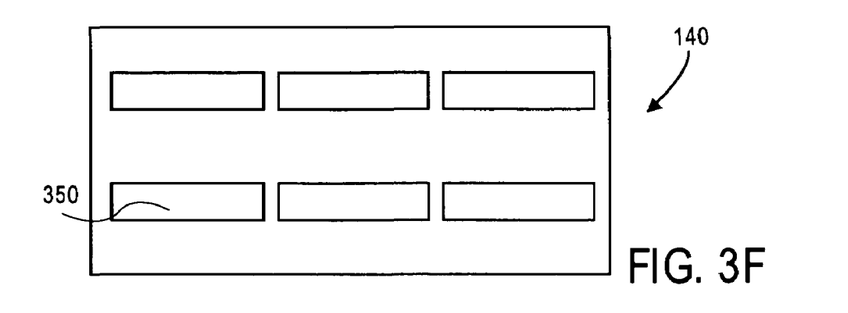
Figure 3G:
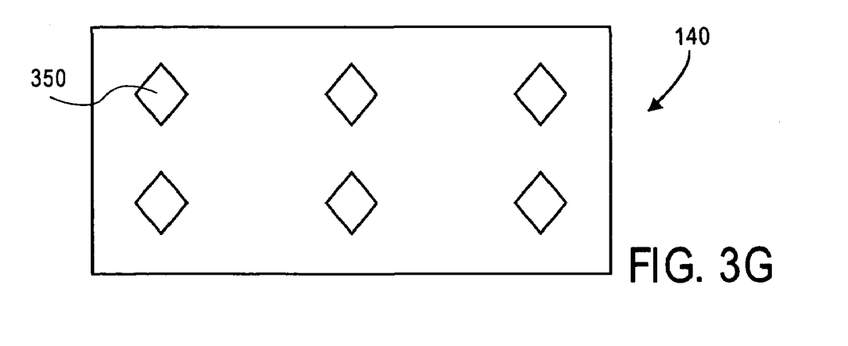
Figure 3H:
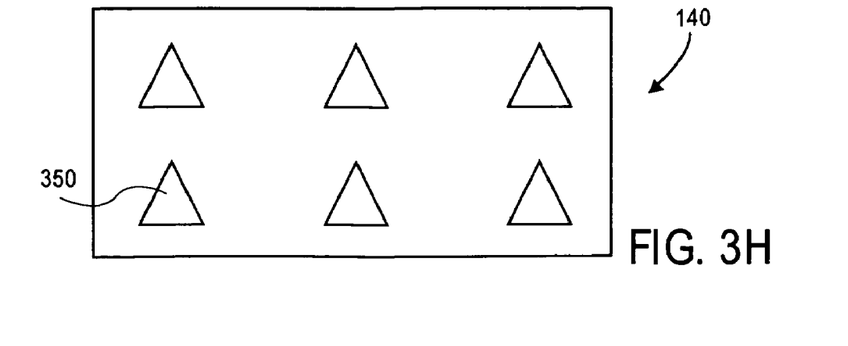

In an embodiment, adhesion holes 350 may have any suitable shape such that a first insulating layer and a second insulating layer contact within. In an embodiment, adhesion holes 350 may have a circular cross-sectional shape as illustrated by FIG. 3A. In another embodiment, adhesion holes 350 may have a rectangular cross-sectional square shape as illustrated in FIG. 3E. In yet another embodiment, adhesion holes 350 may have a different cross-sectional rectangular shape as illustrated in FIG. 3F. In other embodiments, adhesion holes 350 may have different cross-sectional shapes, such as diamonds or triangles, illustrated in FIG. 3G and FIG. 3H respectively, although other shapes are also possible. In an embodiment, adhesion holes set may comprise adhesion holes 350, each having similar shapes as illustrated in FIG. 3A-3H. In other embodiments, adhesion hole set may comprise adhesion holes 350 with non-similar shapes. For example, adhesion hole set may comprise adhesion holes 350 with a circular shape and adhesion holes with a rectangular shape.

Figure 4:
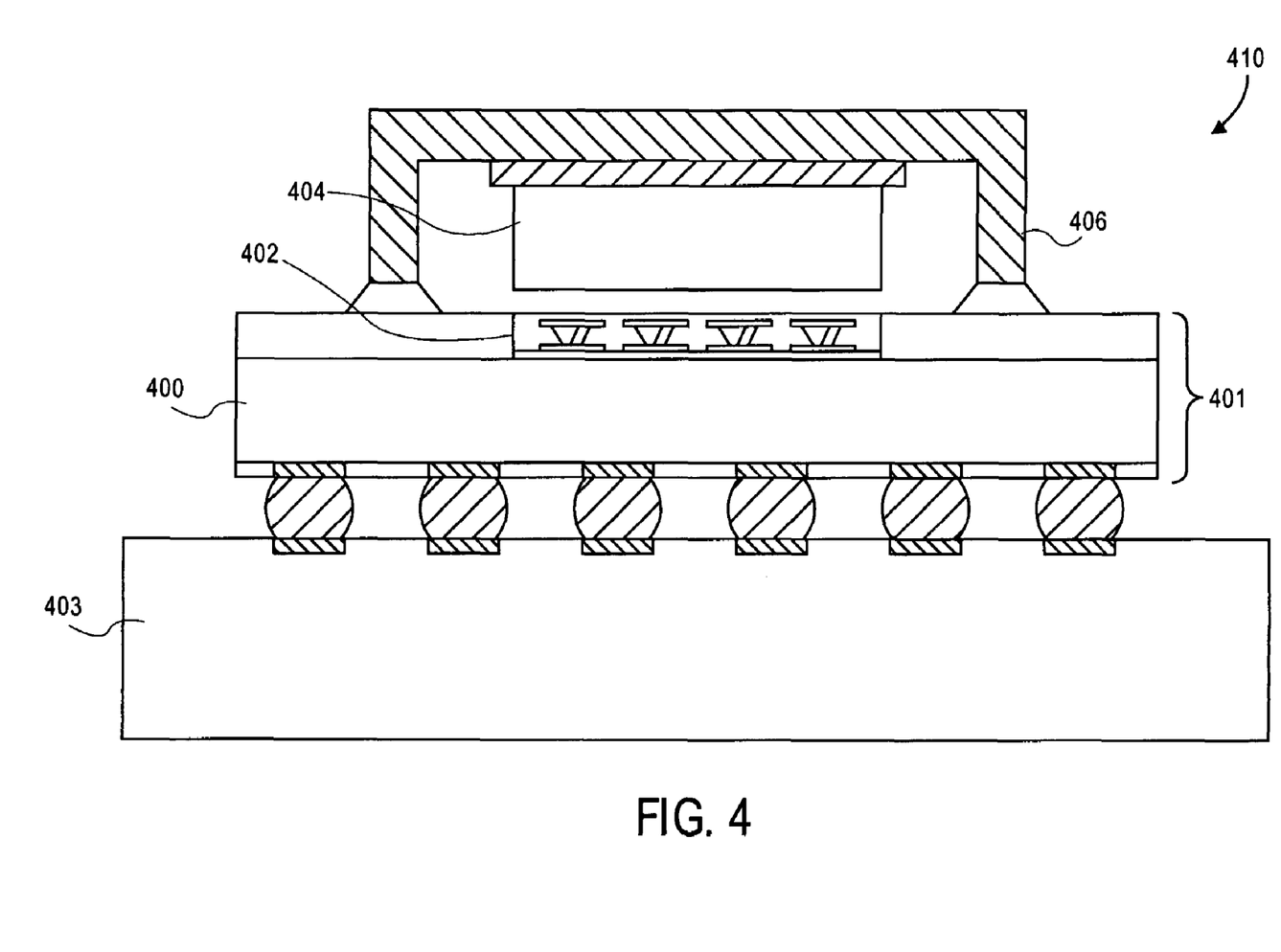
FIG. 4 is a cross-sectional illustration of a capacitor embedded in a substrate featuring an adhesion hole set coupled to a motherboard and a microprocessor die according to an embodiment of the present invention.

In an embodiment of the present invention, device 401 having an integrated thin film capacitor 402 and a substrate 400 may be a component of an electronic package 410 further comprising a microprocessor die 404, a motherboard 403, and a heat sink 406. In an embodiment, device 401 may be positioned between microprocessor die 404 and motherboard 403. In an embodiment, device 401 may facilitate electrical conductivity between microprocessor die 404 and motherboard 403.

Device 401 may be manufactured by any suitable method known in the art. In an embodiment, device 401 may be manufactured by the process illustrated in FIGS. 5A-5E. In an embodiment when manufacturing device 401 according to the process illustrated in FIGS. 5A-5E, first thin film capacitor 402 may be pre-fabricated. Next, in an embodiment, pre-fabricated thin film capacitor 402 may be coupled to substrate 400 comprising a core and a first insulating layer. Then, in an embodiment, device 401 may be patterned such that a conductive via may be formed. Next, in an embodiment, an adhesion hole set is formed in device 401. Then, in an embodiment, a second insulating layer may be formed over the pre-fabricated thin film capacitor portion of device 401.

Figure 5A:
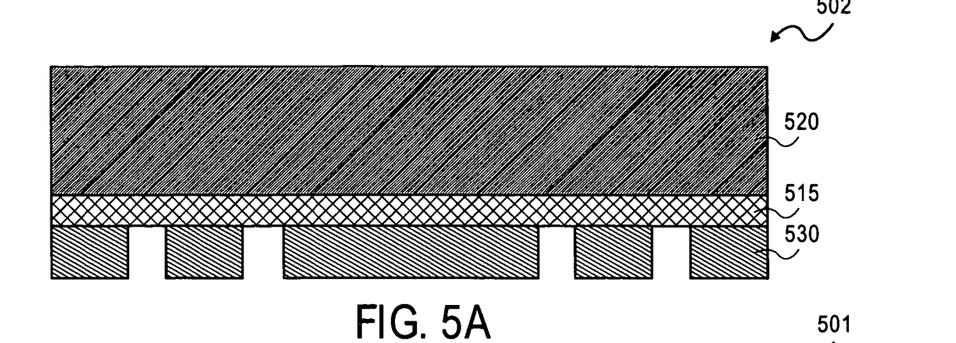
FIG. 5A-5E is a method of forming a capacitor embedded in a substrate featuring an adhesion hole set according to an embodiment of the present invention.
Figure 5B:
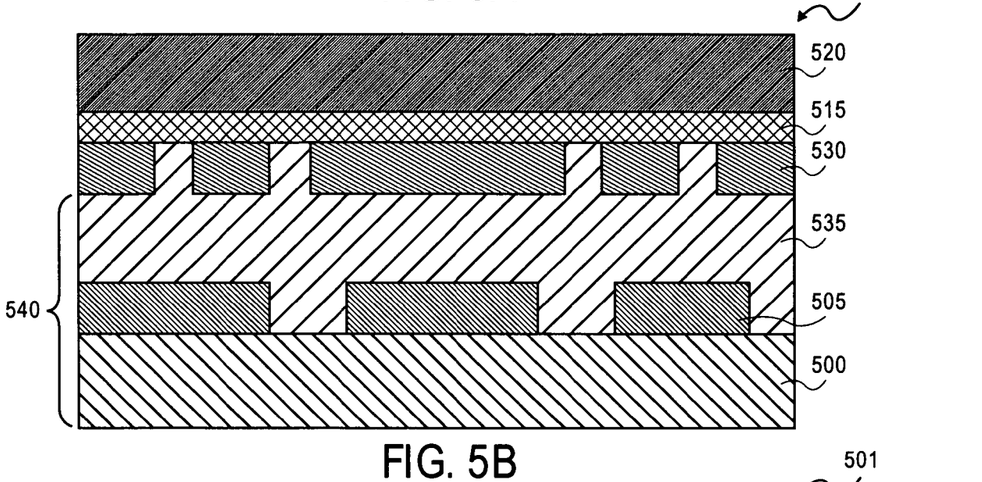

In an embodiment as illustrated in FIG. 5A, thin film capacitor 502 may be pre-fabricated such that a first electrode 520 and a second electrode 530 are disposed above and beneath a dielectric film 515 respectively. In an embodiment, first electrode 520 may be a metal foil. In an embodiment, dielectric film 515 may be formed on the first electrode 520. In an embodiment dielectric film 515 may be formed on the first electrode 520 by a hi-k deposition process such as sol-gel, sputtering, chemical vapor deposition of green sheet technology. In an embodiment, dielectric film 515 may be annealed in furnace at process temperatures between 600-800° C. Next, second electrode 530 may be formed on dielectric film 515 by metal deposition such as sputtering, electroplating technology. In an embodiment, second electrode 530 may also be patterned such that second electrode 530 may not contact conductive areas of a substrate when coupled. In an embodiment, thin film capacitor 502 may be coupled to a substrate comprising a base 500 and a first insulating layer 535 such that thin film capacitor 502 and the substrate become one composite, device 501 as illustrated in FIG. 5B. In an embodiment, thin film capacitor may be coupled by lamination and curing onto polymer dielectric first insulating layer 535. In an embodiment, thin film capacitor 502 may be coupled to a substrate by a lamination and curing process.

Figure 5C:
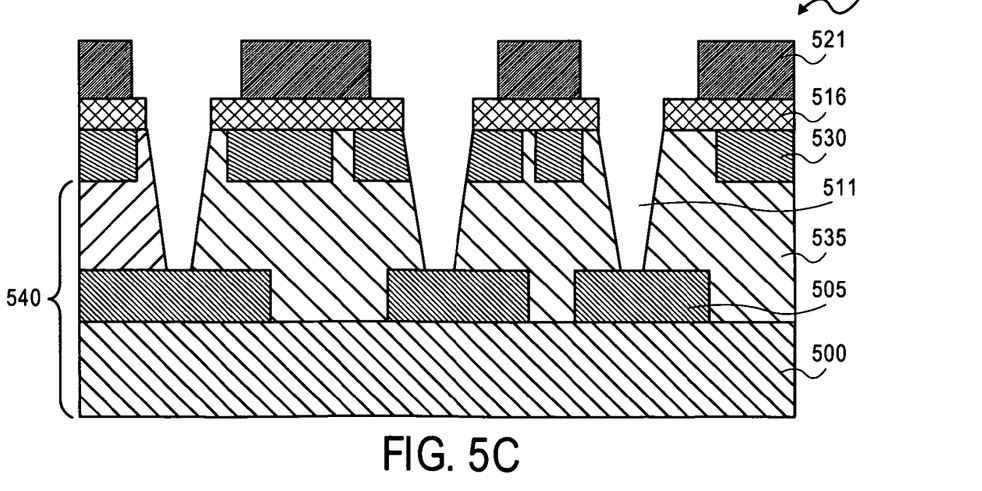

In an embodiment as illustrated in FIG. 5C, device 501 may be further processed to form conductive via 511 such that conductive via 511 extends through dielectric film 515 and first insulating layer 535 to contact 505. In an embodiment, conductive via 511 may be formed by an electro-deposition of metal that uses contact 505 as an electrode. In an embodiment, device 501 may be further processed such that first electrode 520 may be patterned, patterned first electrode 521.

Figure 5D:
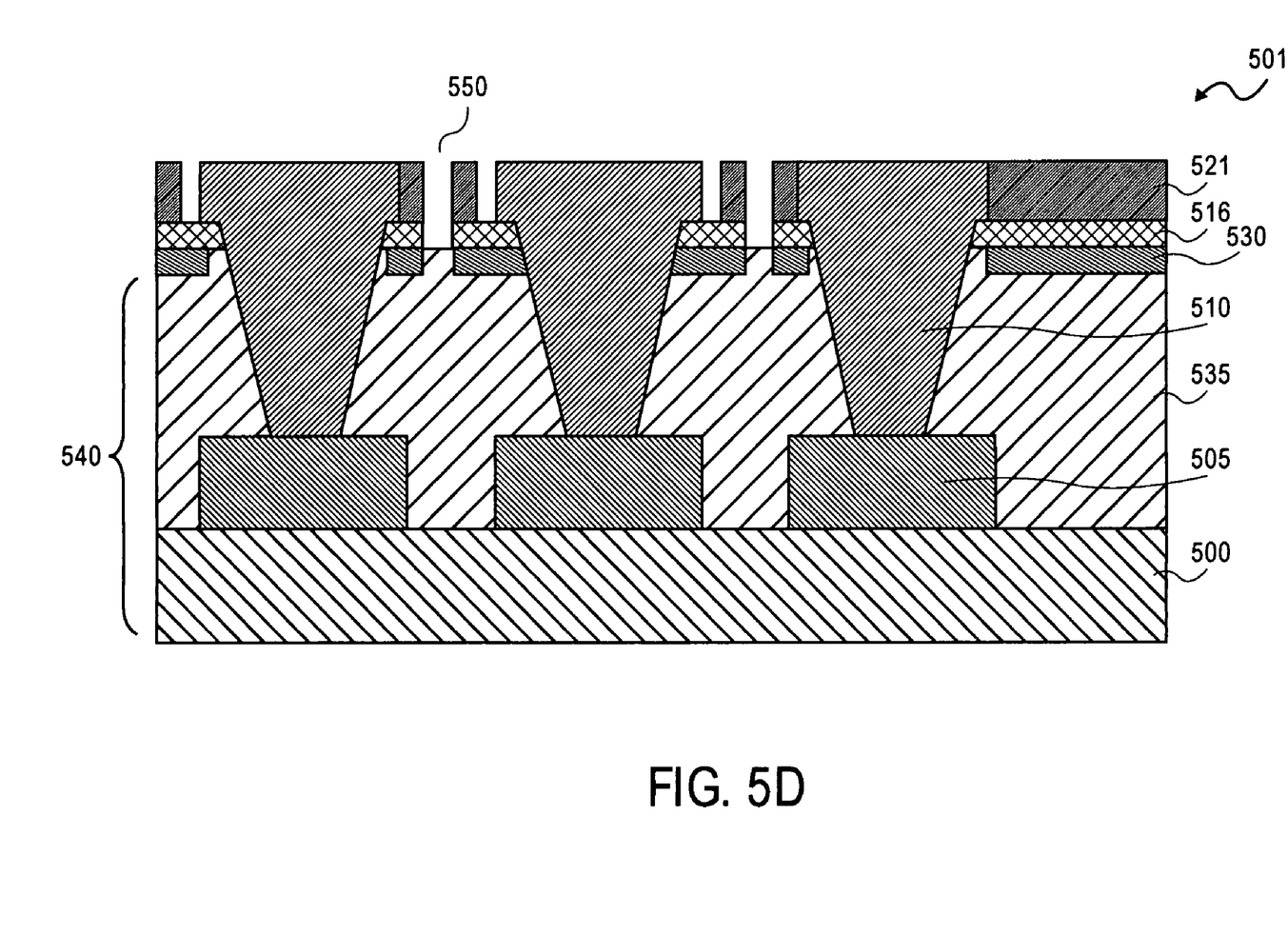

In an embodiment as illustrated in FIG. 5D, conductive via 511 may be filled with any suitable conductive material such as copper or nickel such that the conductive material adequately fills conductive via 511, filled conductive via 510, and is adjacent to contact 505. In an embodiment, conductive via 511 may be filled with copper. In an embodiment, additional conductive material may span a top portion of dielectric film 516. In an embodiment, the additional conductive material may fill in some gaps within patterned first electrode 521.

In an embodiment as further illustrated in FIG. 5D, adhesion hole 550 is formed through first electrode 521, dielectric film 516, and second electrode 530.such that first insulating layer 535 may be exposed. In an embodiment adhesion hole 550 may be formed by wet etching, dry etching, laser processing technology. In an embodiment, adhesion hole 550 may be formed by laser processing.

Figure 5E:
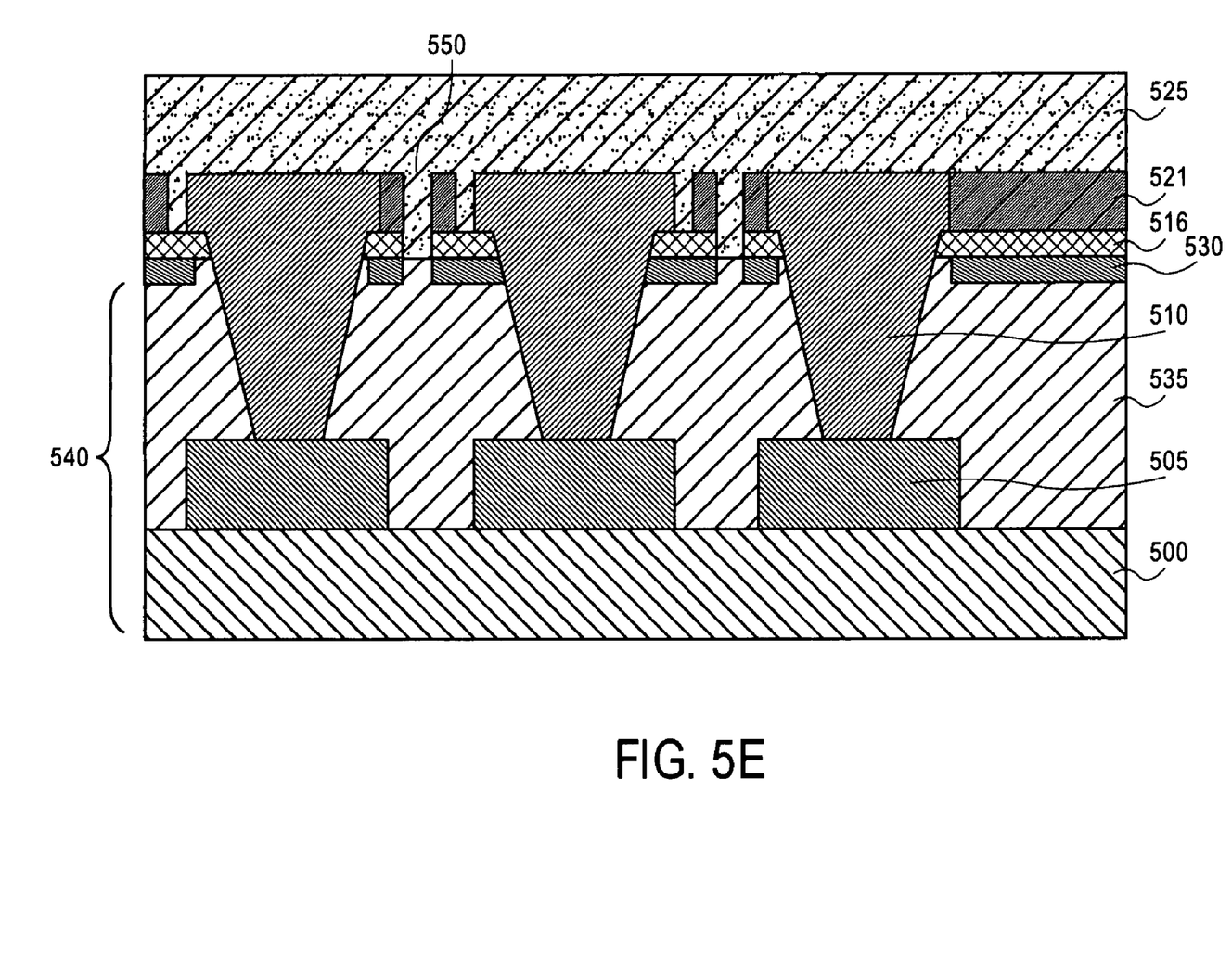

In an embodiment as illustrated in FIG. 5E, a second insulating layer 525 may be formed on device 501 such that a portion of second insulating layer 525 may contact a portion of first insulating layer 535. In an embodiment, second insulating layer 525 may be vacuum laminated and cured over the top surface of device 501.

Figure 6:
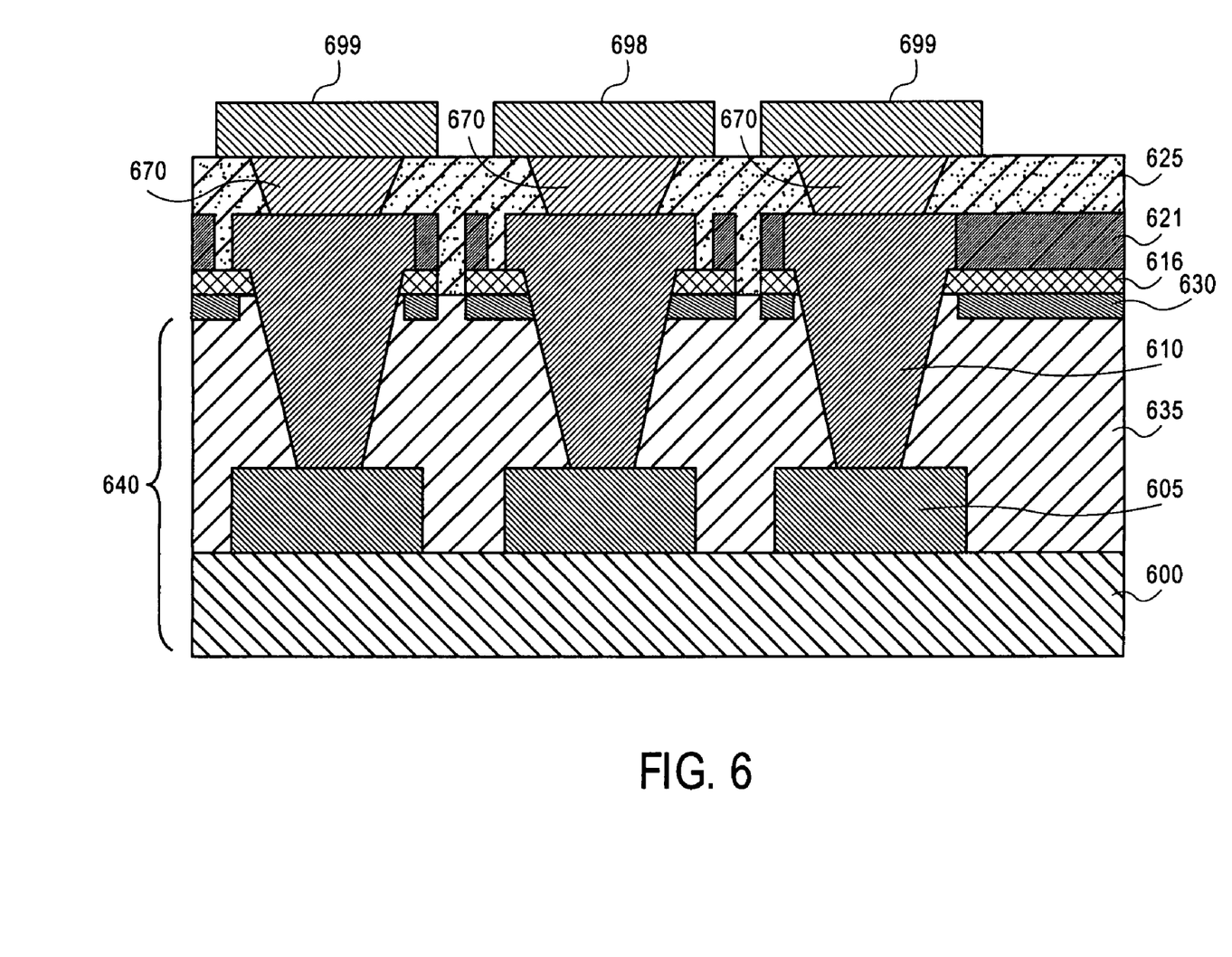
FIG. 6 is a cross-sectional illustration of a capacitor embedded in a substrate featuring an adhesion set coupled to a semiconductor die according to an embodiment of the present invention.

In an embodiment as illustrated in FIG. 6, a build-up process such as laser via drilling, via filling, and pad patterning can be performed to electrically couple a semiconductor die to a package substrate featuring base 600, contact 605, filled conductive via 610, first insulating layer 635, second insulating layer 625, first electrode 621, second electrode 630, and dielectric film 616. As further illustrated in FIG. 6, semiconductor dies 698, 699 are coupled to the package substrate through vias 670. In an embodiment, semiconductor dies 698 are electrically coupled to second electrode 630 but not first electrode 621 and semiconductor 699 are electrically coupled to a first electrode 621 but not a second electrode 630.

The invention claimed is:

1. A device comprising:
   a base;
   a first insulating layer on said base;
   a first electrode on said first insulating layer;
   a dielectric film on said first electrode;
   a second electrode on said dielectric film; and
   a second insulating layer on said second electrode,
   wherein:
      an adhesion hole set extends in a vertical direction through said first electrode, said dielectric film, and said second electrode;
      a portion of said second insulating layer contacts said first insulating layer within said adhesion hole set;
      said first insulating layer and said second insulating layer fill said adhesion hole set to the exclusion of any other material;
      said first electrode, said dielectric film, and said second electrode form a structure having a cross-sectional area lying in a horizontal dimension that is substantially perpendicular to the vertical direction;
      the cross-sectional area is bounded by a perimeter, and said adhesion hole set is entirely contained within said perimeter.

2. The device of claim 1, wherein said first insulating layer and said second insulating layer comprise the same material.

3. The device of claim 1, wherein said adhesion hole set consists of one adhesion hole.

4. The device of claim 3, wherein
   a cross-sectional shape of said one adhesion hole is selected from the group consisting of circular, square, rectangular, diamond, and triangular.

5. The device of claim 1, wherein the thickness of said first electrode is in the range from 10 to 100 microns.

6. The device of claim 1, wherein the thickness of said dielectric film is in the range from 1 to 5 microns.

7. The device of claim 1, wherein the thickness of said second electrode is in the range from 10 to 20 microns.

8. The device of claim 1, wherein said adhesion hole set comprises a uniform pitch.

9. An electronic package comprising:
   a device having a capacitor coupled to a substrate;
   a first material above said capacitor;
   a second material below said capacitor;
   a microprocessor die coupled to a first side of said device; and
   a motherboard coupled to a second side of said device,
   wherein:
      said capacitor extends in a vertical direction between said first material and said second material;
      the capacitor has a cross-sectional area lying in a horizontal dimension that is substantially perpendicular to the vertical direction;
      the cross-sectional area is bounded by a perimeter;
      said capacitor comprises an adhesion hole set, said adhesion hole set being entirely contained within the perimeter of said cross-sectional area; and
      said first material and said second material:
         contact each other through said adhesion hole set; and
         fill said adhesion hole set to the exclusion of any other material.

10. The electronic package of claim 9, wherein said adhesion hole set comprises a first adhesion hole and a second adhesion hole.

11. The electronic package of claim 10, wherein the area of said first adhesion hole is greater than the area of said second adhesion hole.

12. The electronic package of claim 10, wherein the shape of said first adhesion hole is similar to the shape of said second adhesion hole.

13. The device of claim 9,wherein
   the capacitor further comprises a first electrode, a second electrode over the first electrode, and a dielectric film between the first electrode and the second electrode;
   the device further comprises a via; and
   the via extends through the substrate, the first electrode, the dielectric film, and the second electrode.

* * * * *